(12) United States Patent
Gaudin

(10) Patent No.: US 8,790,992 B2
(45) Date of Patent: Jul. 29, 2014

(54) LOW-TEMPERATURE BONDING PROCESS

(75) Inventor: Gweltaz Gaudin, Grenoble (FR)

(73) Assignee: Soitec, Bernin (FR)

( * ) Notice: Subject to any disclaimer, the term of this patent is extended or adjusted under 35 U.S.C. 154(b) by 154 days.

(21) Appl. No.: 12/904,744

(22) Filed: Oct. 14, 2010

(65) Prior Publication Data

US 2012/0043647 A1 Feb. 23, 2012

(30) Foreign Application Priority Data

Aug. 20, 2010 (FR) ...................... 10 56696

(51) Int. Cl.
*H01L 21/30* (2006.01)
(52) U.S. Cl.
USPC .......................................... 438/455; 257/618
(58) Field of Classification Search
USPC ............................ 257/618; 438/455–459, 406
See application file for complete search history.

(56) References Cited

U.S. PATENT DOCUMENTS

| 6,475,072 | B1 | 11/2002 | Canaperi et al. | 451/65 |
| 6,902,987 | B1 | 6/2005 | Tong et al. | 438/455 |
| 8,257,528 | B2 | 9/2012 | Yagihashi et al. | 156/87 |
| 2003/0211705 | A1 | 11/2003 | Tong et al. | 438/455 |
| 2004/0152282 | A1 | 8/2004 | Tong et al. | 438/455 |
| 2004/0235266 | A1 | 11/2004 | Tong | 438/455 |
| 2006/0054891 | A1 | 3/2006 | Chu et al. | |
| 2006/0079712 | A1 | 4/2006 | Haupfear et al. | 562/17 |
| 2006/0216904 | A1 | 9/2006 | Tong | 438/406 |
| 2006/0255341 | A1* | 11/2006 | Pinnington et al. | 257/79 |
| 2008/0187757 | A1 | 8/2008 | Tong | 428/411.1 |
| 2009/0004821 | A1 | 1/2009 | Shimomura et al. | 438/458 |
| 2009/0111243 | A1 | 4/2009 | Landru et al. | 438/458 |
| 2009/0134460 | A1* | 5/2009 | Adam et al. | 257/347 |
| 2010/0096733 | A1 | 4/2010 | Guiot et al. | 257/632 |

FOREIGN PATENT DOCUMENTS

| JP | 2000-101019 | | 4/2000 |
| JP | 2007515779 | A | 6/2007 |
| JP | 2008512868 | A | 4/2008 |
| KR | 10-2008-0107352 | | 12/2008 |
| KR | 10-2010-0021354 | | 2/2010 |
| WO | WO 01/61743 | | 8/2001 |
| WO | WO2004105084 | A2 | 12/2004 |
| WO | WO 2005/034218 | | 4/2005 |
| WO | WO2006031247 | A2 | 3/2006 |

OTHER PUBLICATIONS

French Search Report Application No. FR 1056696, dated Apr. 13, 2011.

(Continued)

*Primary Examiner* — Shaun Campbell
(74) *Attorney, Agent, or Firm* — TraskBritt

(57) ABSTRACT

The invention relates to a process for assembling a first element that includes at least one first wafer, substrate or at least one chip, and a second element of at least one second wafer or substrate, involving the formation of a surface layer, known as the bonding layer, on each substrate, at least one of these bonding layers being formed at a temperature less than or equal to 300° C.; conducting a first annealing, known as degassing annealing, of the bonding layers, before assembly, at least partly at a temperature at least equal to the subsequent bonding interface strengthening temperature but below 450° C.; forming an assembling of the substrates by bringing into contact the exposed surfaces of the bonding layers, and conducting an annealing of the assembled structure at a bonding interface strengthening temperature below 450° C.

20 Claims, 4 Drawing Sheets

(56) References Cited

OTHER PUBLICATIONS

Tan, C.S. et al., "Low-Temperature Thermal Oxide to Plasma-Enhanced Chemical Vapor Deposition Oxide Wafer Bonding for Thin-Film Transfer Application", Applied Physics Letters, vol. 82, No. 16, pp. 2649-2651 (2003).

Topol, Anna W. et al., "3D Fabrication Options for High-Performance CMOS Technology", Wafer Level 3-D ICs Process Technology, Tan-Gutmann-Reif Editors, pp. 197-217.

\* cited by examiner

LTO SILANE   TEOS   SILANE

LOW-TEMPERATURE BONDING PROCESS

FIELD OF THE INVENTION

The invention relates to the bonding, at low temperature, of a first substrate, wafer or chip with a second, substrate, wafer or chip. It is sought to obtain bonding that has the best possible quality and the best possible bonding energy, despite the use of low temperatures. The invention finds, in particular, its application in the field of the manufacture of composite substrates, or in the 3D integration of components. More generally, it may find an application for any formation of a structure by direct (or "molecular") bonding, when the structure cannot undergo high-temperature heat treatment due to the presence of components or due to the nature of the materials, in particular due to the presence of circuits or micro-components in one of the elements to be assembled.

BACKGROUND OF THE INVENTION

The work "Wafer level 3-D ICs Process technology" C. S. Tan et al. Editors, p. 197-217 presents a review of 3D technology. It discloses a bonding process comprising deposition of a bonding layer at low temperature and degassing annealing of this oxide at a temperature above the deposition temperature of this oxide. When this technique is used, the presence of defects at the bonding interface is observed. In turn, these defects may adversely affect the bonding energy. Therefore, the problem arises of finding a novel process for achieving the assembly of two elements, via bonding layers, at low temperature.

SUMMARY OF THE INVENTION

The invention relates generally to a process for assembling a first element and a second element to form a hetero-structure, wherein the first element and second element can be a wafer, substrate or chip with a bonding layer formed on each. The invention also relates to the heterostructure or assembly formed by the disclosed process comprising a first wafer, substrate or one or more chips; a bonding layer formed on the first wafer, substrate or one or more chips; a second wafer or substrate; a bonding layer formed on the second layer or substrate, wherein the first wafer, substrate or one or more chips is attached to the second wafer or substrate at the free or exposed surfaces of the bonding layers to form a bonding interface, and the bonding interface is annealed to form the assembly having a bonding energy of at least 3 J/m² at the interface.

The invention specifically relates to a method for bonding two surfaces at low temperatures comprising providing a first substrate, providing a second substrate, forming at a low temperature a first bonding layer on the first substrate and a second bonding layer on the second substrate, wherein the formation of at least one of the first or second bonding layers is done at a temperature less than or equal to 300° C., and wherein the first bonding layer and the second bonding layer each have an exposed surface, conducting a first annealing of the first and second bonding layers on the first and second substrates for a first annealing time period, assembling the first and second substrates to form a structure by bringing into contact the exposed surfaces of the first bonding layer and the second bonding layer, wherein contacting the exposed surfaces of the first bonding layer and the second bonding layer produces bonding by molecular adhesion, conducting a second annealing at a second temperature below 450° C., of the first and second bonding layers on the first and second substrates after assembling the structure, wherein the temperature of the first annealing is at a temperature at least equal to the second annealing temperature for at least a portion of the first annealing time period.

The first annealing of the first and second bonding layers at a temperature below 450° C. removes contaminants from the bonding layers. The temperature of the first annealing increases at a rate between 1° C./min and 5° C./min to provide a gradual temperature ramp. The temperature of the first annealing may also be increased rapidly. The first annealing time period lasts between 10 minutes and 5 hrs, or the first annealing time period lasts between 30 minutes and 2 hrs. The first annealing may also last for about 12 hrs. The first annealing temperature is held at least the second annealing temperature, but below 450° C., for at least a portion of the first annealing time period.

In one embodiment, at least one of the bonding layers is formed by a PECVD or a LPCVD deposition. In another embodiment, at least one of the bonding layers is formed at a temperature less than or equal to 250° C. At least one of the bonding layers is an oxide or a nitride material, and at least one of the bonding layers may be a silicon oxide. The surfaces of the first bonding layer and the second bonding layer may be prepared for bonding before assembling the first and second substrates, wherein the preparing of the surfaces is by chemical-mechanical polishing.

The second annealing is a bonding interface strengthening annealing that may be conducted at a temperature ($T_r$) below 400° C.

The method can also further comprise cutting of one of the substrates into one or more chips, before assembling the first and second substrates to form a structure, so that individual chips may be assembled with the other substrate. In another embodiment, either the first substrate and first bonding layer or the second substrate and second bonding layer may be cut up into one or more chips. At least one of the substrates or chips being at least partly made of a semiconductor material.

In another preferred embodiment, at least one of the first substrate or the second substrate may comprise one or more components, micro-components or circuits.

The invention also specifically relates to a heterostructure, as formed by the described method, comprising a first substrate, a first bonding layer on the first substrate, wherein the first substrate and first bonding layer are annealed, a second substrate, a second bonding layer on the second substrate, wherein the second substrate and second bonding layer are annealed, and the second bonding layer is in contact with the first bonding layer to form a bonding interface, wherein the bonding interface has a bonding energy of at least 4 J/m². At least one of the bonding layers may be an oxide or nitride material, and at least one of the substrates may be at least partly made of a semiconductor material. The bonding between the first and second bonding layers at the bonding interface is of molecular adhesion type. In one variant, at least one of the first substrate or the second substrate comprises one or more components.

DETAILED DESCRIPTION OF THE INVENTION

Figure 1A:
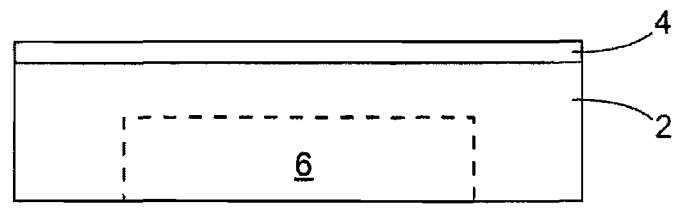
FIGS. 1A to 1C represent one embodiment of a process according to the invention.

The present invention relates to a method of bonding together the surfaces of two substrates comprising semiconductor materials at low temperatures using bonding layers that are also formed at low temperatures, as well as the heterostructure formed by the present method. The present invention preferentially applies to structures that cannot withstand high treatment temperatures, in particular, due to the presence of components, microcomponents or circuits in one or both of the elements to be bonded. The invention can be applied to the manufacture of composite substrates and the 3D integration of components. The present invention avoids the formation of surface defects and overcomes the disadvantages of the prior low temperature bonding processes.

The inventive method involves forming a bonding layer on each of the surfaces of the elements to be joined, where the surfaces can be the surface of a wafer, substrate or portions of a wafer or substrate, such as diced chips where a wafer or substrate has been cut up into separate pieces. The wafers may be for example a semiconductor material such as silicon or germanium, an insulator material such as alumina ($Al_2O_3$), or a glass. At least one of the substrates or chips may be at least partially made of a semiconductor material such as silicon for example.

A wafer or substrate may also be referred to as a plate. It should also be noted that where only one term such as substrate is used in the following description of the invention it is implied that wafers and chips may also be included in the description of the invention, and that reference to inventive elements in the singular also refers to elements in the plural and vice versa.

The surfaces or surface layers of the wafers, substrates or chips may include one or more electronic and/or optical components and/or one or more micro-electro-mechanical systems (MEMS) and/or nano-electro-mechanical systems (NEMS).

The bonding layer(s) formed on the wafers, substrates, or chips, is an oxide or a nitride type material, such as silicon oxide ($SiO_2$) or silicon nitride ($Si_3N_4$) for example. The bonding layer(s) are formed by preferably plasma enhanced chemical vapor deposition (PECVD) or low pressure chemical vapor deposition (LPCVD), at a low temperature, i.e. below 300° C., or more preferably at or below 250° C. The precursor gasses used to form the bonding layer may be for example tetraethyl orthosilicate (TEOS), silane ($SiH_4$), or $N_2O$. The bonding layer(s) formed by PECVD or LPCVD deposition preferably has a thickness between 200 nm and 4 µm. The bonding layer(s) obtained by this method are porous and not very dense.

After being formed on a plate (meaning either a substrate or wafer), or chip, the bonding layers are subjected to a first annealing to extract pollutants or contaminants (also referred to as a degassing annealing), such as the gaseous precursors from the deposition process or carbon chain based species, from the layers before assembling them, so they would not be present to cause damage during subsequent heat treatments after the substrates have been bonded. The annealing temperature of this first annealing is at least equal to the annealing temperature of a subsequent annealing after the substrates have been bonded. This degassing annealing of the bonding layers is at a temperature below 450° C. The first annealing should be conducted at a temperature at least equal to a subsequent bonding interface strengthening temperature $T_r$, for at least a part of the time period of the first annealing.

After the substrates, wafers and/or chips with formed bonding layers have been subjected to a first annealing, the structures are assembled by bringing the exposed surfaces of the bonding layers into contact. The substrates are assembled and the surfaces of the bonding layers are bonded by molecular adhesion.

Before either the first annealing or the bonding steps, the surfaces of the bonding layer(s) on the plates may be prepared by surface planarization such as by a chemical-mechanical polishing, so as to provide a roughness compatible with molecular bonding (roughness <0.5 nm RMS), then by cleaning, which may be supplemented by a brushing of the substrate surfaces to be assembled.

After the surfaces of the substrates have been attached, the assembled structure undergoes a second annealing to strengthen the interface bonding. This annealing of the assembled structure is at a bonding interface strengthening temperature ($T_r$) below 450° C.

Both the first annealing (degassing annealing) and second annealing (bond strengthening annealing) are conducted at or below a maximum temperature ($T_{max}$) that can be used due to the presence of components or circuits on the substrate.

In a preferred embodiment, the annealing temperature for the degassing annealing is ramped up from an ambient temperature to a temperature at least equal to the intended bonding interface strengthening temperature (Tr). The temperature ramp up may be very gradual or very rapid. The degassing anneal is then maintained at the temperature $T_r$ for between 10 minutes and 5 hours, or more preferably between 30 minutes and 2 hours.

Generally, in the process according to the invention, the low temperatures are those that are kept below 450° C. or more preferably even below 400° C., due to the presence of components or circuits in one and/or the other of the substrates. This condition is met in regards to the step of forming the bonding layer, since this low temperature forming step is preferably carried out at a temperature below 350° C., or more preferably below 300° C., or most preferably below 250° C.

In an alternate embodiment, one of the substrates is cut up into to form a plurality of chips that can be attached to a second substrate to form a heterostructure.

The process according to the present invention makes it possible to obtain high bonding energies at the interface, of the order of several $J/m^2$, for example greater than 3 $J/m^2$ or 4 $J/m^2$, and of good quality. Indeed, the result of using the process is an absence of defects of "bubble" type at the bonding interface. The bonding energy may be measured, for example, by the technique known as the "blade technique" (or "double cantilever technique").

The same principle may be applied to the bonding of one or more chips on a substrate: it is sufficient to cut up one of the wafers or substrates, before or after the first annealing according to the invention, in order to form one or more chips. These chips are then assembled individually on the second wafer or substrate.

The invention also relates to a heterostructure, comprising a first element of at least one first wafer, substrate or at least one chip and a porous surface layer, called a bonding layer, formed on the first wafer, substrate or at least one chip, and a second element comprising at least one second wafer or substrate and a porous surface layer, called a bonding layer, formed on the second wafer or substrate, wherein the two elements are assembled via the bonding layers, the assembly having a bonding energy at least equal to 3 $J/m^2$. At least one of the bonding layers may be of an oxide or nitride type material, for example silicon oxide or silicon nitride. In an alternate, at least one of the first wafer, substrate or one or more chips or the second wafer or substrate may also comprise one or more components, micro-components or circuits.

In summary, the invention relates to a process for assembling a first element comprising at least one first wafer, substrate or at least one chip, and a second element comprising at least one second wafer or substrate, this process comprising:

a) formation of a surface bonding layer, on each substrate, at least one of which is formed at a temperature less than or equal to 300° C.;

b) a first annealing, called degassing annealing, of the bonding layers, before assembling, at least partly at a temperature at least equal to the subsequent bonding interface strengthening temperature (Tr), but below 450° C.;

c) an assembling of the substrates by bringing into contact the exposed surfaces of the bonding layers, d) an annealing of the assembled structure at a bonding interface strengthening temperature (Tr) below 450° C.

At least one of the two bonding layers may be formed by deposition, for example by deposition of PECVD or LPCVD type.

At least one of the bonding layers may be of oxide or nitride type, for example silicon oxide $SiO_2$ or silicon nitride $Si_3N_4$.

The annealing step b) may comprise:
the generation of a temperature ramp, in order to bring the temperature gradually from an ambient temperature to a temperature at least equal to the post-assembly annealing temperature;
and/or, over a period for example between 10 minutes or 30 minutes and 2 h or 5 h, holding the temperature at least the subsequent bonding interface strengthening temperature (Tr), but below 450° C.

A process according to the invention may additionally comprise, before step c) or before step b), a step for preparing the surface of the porous surface layers with a view to the assembling step.

The assembly of step c) is, for example, of the molecular adhesion type.

At least one of the first substrate or chip and of the second substrate may comprise one or more components.

A process according to the invention may furthermore comprise, before the assembling step c), a step of individual cutting of one of the substrates, with a view to forming one or more chips to be assembled with the other substrate.

At least one of the substrates or chips may be at least partly made of a semiconductor material, for example made of silicon.

The invention also relates to a heterostructure, comprising a first element comprising at least one first substrate or at least one chip, and a second element comprising at least one second substrate, each element comprising a porous surface layer, called a bonding layer, the two elements being assembled via the bonding layers, the assembly having a bonding energy at least equal to 3 J/m².

At least one of the bonding layers may be of oxide or nitride type, for example silicon oxide or silicon nitride.

At least one of the substrates or chips may be at least partly made of a semiconductor material, for example made of silicon.

Preferably, the assembling between the bonding layers is of molecular adhesion type.

More preferably, at least one of the first substrate or chip and of the second substrate comprises one or more components.

The following non-limiting examples of preferred embodiments are provided in reference to the accompanying drawings to further highlight the features and advantages of the present invention. It is understood that such embodiments do not represent the full scope of the invention, for which reference should be made to the claims.

Figure 1B:
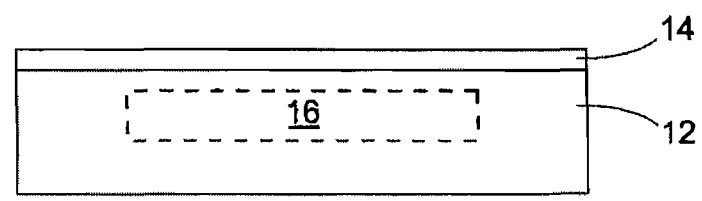
Figure 1C:
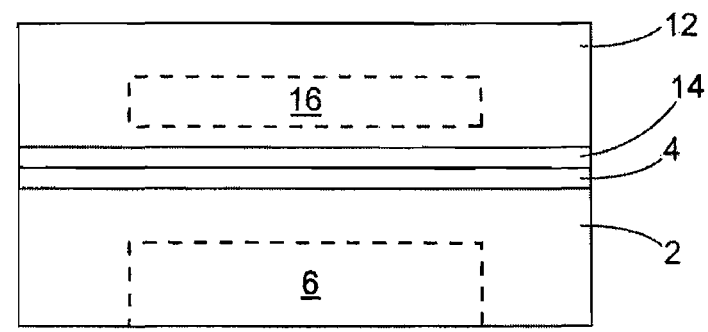

A first exemplary embodiment of the invention is represented in FIGS. 1A-1C.

In this example as illustrated in FIG. 1A, a bonding layer 4 is formed, at the surface of a first substrate 2, wherein the bonding layer 4 may be a thin oxide layer. The first substrate may be for example made of a semiconductor material, advantageously made of silicon, or of germanium, or of alumina ($Al_2O_3$), or of glass. This bonding layer is formed at a low temperature. In one example the bonding layer may be formed below 300° C. The oxide is, for example, a silicon oxide, $SiO_2$. The bonding layer may be formed by a deposition technique, which may be a PECVD technique. A precursor gas may be, for example, of TEOS (tetraethyl orthosilicate) or $SiH_4$ or $N_2O$ type.

This oxide bonding layer 4 has a thickness, for example, between 200 nm and 4 µm. The substrate 2 may have features, denoted globally by the reference numeral 6, that make it possible to provide one or more electric or electronic or other functionalities, for example one or more electronic and/or optical components and/or one or more MEMS and/or NEMS.

Another bonding layer 14, is formed on a second substrate 12 (see FIG. 1B), wherein the bonding layer 14 may be a thin oxide layer. This bonding layer 14 is formed at low temperature, below 300° C. The oxide is, for example, a silicon oxide, $SiO_2$. The bonding layer may be formed by a deposition technique, which may be a PECVD technique. A precursor gas may be one of those already indicated above.

This oxide bonding layer 14 has a thickness, for example, between 200 nm and 4 µm. The substrate 12 may also have features, denoted globally by the reference numeral 16, that make it possible to provide one or more electric or electronic or other functionalities, for example one or more electronic and/or optical components and/or one or more MEMS and/or NEMS.

The formation of at least one of the bonding layers on the surfaces of the substrates 2, 12 is conducted at a temperature less than or equal to 300° C. At least one of the bonding layers 4, 14 may be formed by a PECVD or LPCVD deposition. Each of the bonding layers 4, 14 obtained is porous and not very dense.

In the process according to the invention, the temperature is kept below 450° C. or more preferably below 400° C., due to the presence of components 6, 16 in one and/or the other of the substrates. This condition is respected as regards the step of forming the bonding layer, since, as indicated above, this step is carried out at a temperature below 250° C. or 300° C. or 350° C.

Each of the layers 4, 14 may be formed by deposition, for example of LPCVD or PECVD type.

Before assembling the two substrates, a first annealing of the bonding layers 4, 14 is carried out. During this annealing, the temperature to which these layers 4, 14 are subjected reaches at least the temperature $T_r$ which will then be used, after assembling, for, carrying out a strengthening of the bonding interface. This bond strengthening temperature $T_r$ is itself below the maximum temperature $T_{max}$ that can be used, due to the presence of components 6, 16, for example 400° C. or 450° C.

This step of annealing the layers 4, 14, before assembling, is to avoid forming defects at the assembly interface. Each bonding layer, deposited at low temperature, contains numerous contaminants, for example derived from a gaseous precursor such as $N_2O$ or of the carbon-based chains type. If they are not eliminated beforehand, these pollutants will have a tendency to migrate (degas) during the subsequent strengthening annealing of the bonding interface, after assembling the two substrates, and to form "bubbles" or other defects at the bonding interface of these two substrates. Such bubbles cannot be eliminated and render the assembly obtained unusable.

For example, in one embodiment, the first annealing or degassing temperature rises gradually, according to a ramp, from ambient temperature until at least the strengthening temperature $T_r$, or a temperature above the latter, but below the maximum temperature $T_{max}$ that can be used, is reached.

Figure 2A:
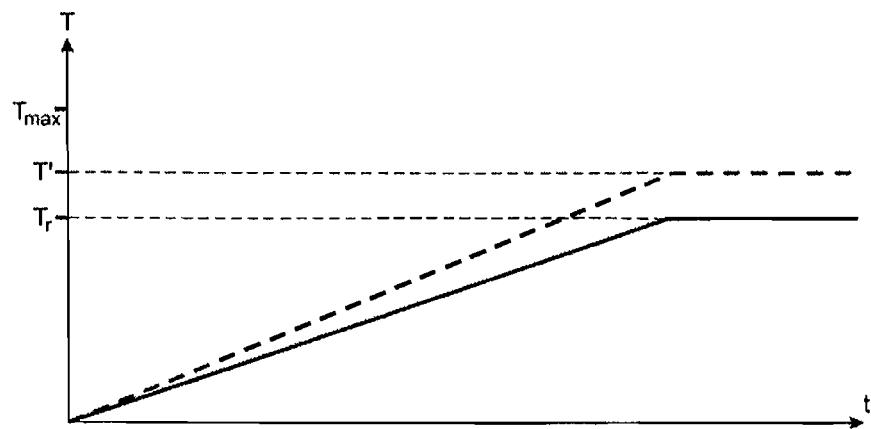
FIGS. 2A to 2C represent various plots of the change in temperature during a step of annealing the bonding layers, before assembly, in accordance with the invention.

An example of a temperature ramp for the first annealing is represented in FIG. 2A, in which the temperature climbs very gradually, for example with a slope between 1° C./min and a few ° C./min, for example between 1° C./min and 5° C./min, reaches the bond strengthening temperature $T_r$, for example 350° C., then is held at this temperature $T_r$ over a portion of the first annealing time period, t, for a few hours, for example 2 to 5 hrs.

According to one variant of the embodiment, represented by the broken line in FIG. 2A, the temperature may increase, with a gradual slope as above, up to a temperature T', which is greater than the bond strengthening temperature $T_r$, and at or below the maximum temperature $T_{max}$, such that T' is between $T_r$ and $T_{max}$, where the latter is, for example, equal to 400° C. or 450° C.

Figure 2B:
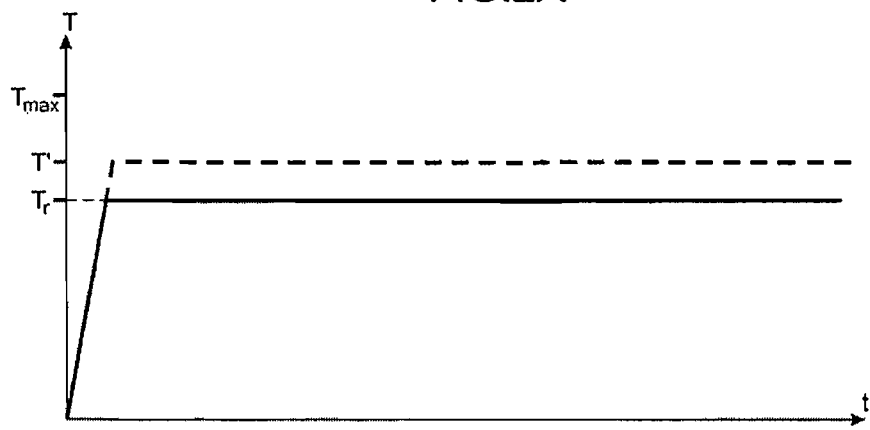

According to another embodiment, represented in FIG. 2B, the temperature increases very rapidly up to the bond strengthening temperature $T_r$, and then is stabilized at this value for one or more hours. According to one variant of this embodiment, represented by the broken line in FIG. 2B, the temperature increases very rapidly up to a temperature T', above the strengthening temperature $T_r$, and at or below the maximum temperature $T_{max}$, such that T' is between $T_r$ and $T_{max}$ over a portion of the first annealing time period t, where the latter is, for example, equal to 400° C. or 450° C.

Figure 2C:
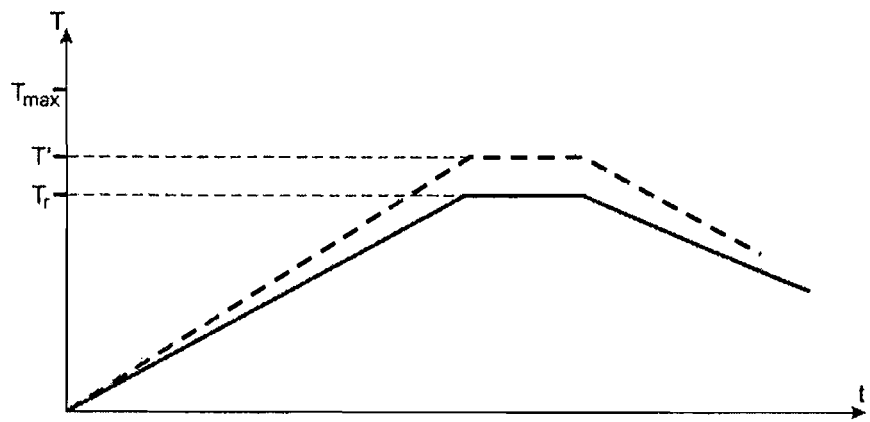

According to another embodiment, represented in FIG. 2C, the temperature increases very gradually, for example with a slope between 1 and a few ° C./min, for example between 1° C./min and 5° C./min, reaches the strengthening temperature $T_r$, for example 350° C., then is held at this temperature for a relatively brief time, for example between 10 minutes and 2 hours, then is gradually brought back to ambient temperature over the first annealing time period t.

According to one variant of this embodiment, represented by the broken line in FIG. 2C, the temperature increases with a very gradual slope, as above, reaches a temperature T' above the strengthening temperature $T_r$, but below the maximum temperature $T_{max}$, then is held at this temperature T' between $T_r$ and $T_{max}$, for a relatively brief time, for example between 10 minutes and 2 hours, then is gradually brought back to ambient temperature over the first annealing time period.

The first annealing step, explained above in connection with FIGS. 2A-2C, makes it possible to extract these polluting species from the bonding layers 4, 14 without leading to a significant reduction in the porosity of these layers. It therefore makes it possible, in addition, to preserve the advantageous properties of the porous bonding materials. A first annealing temperature, between the maximum temperature $T_{max}$ and the bonding interface strengthening temperature $T_r$, is reached during this degassing annealing step before assembly of the substrates. The polluting species are definitely extracted from the bonding layers 4, 14, and therefore will not be damaging during the bond strengthening anneal step, since they will have been eliminated beforehand by conducting the first annealing at a temperature at least equal to that of the subsequent bond strengthening annealing over a portion of the first annealing time period.

As illustrated in FIG. 1C, the two annealed substrates are assembled via the exposed surfaces of the bonding layers 4, 14. This assembly step may be preceded by a preparatory treatment step such as surface planarization, for example chemical mechanical polishing (CMP), then by cleaning.

Finally, the structure once assembled is annealed at the bond strengthening temperature $T_r$, which is less than or equal to the first annealing temperature, which is less than or equal to the maximum temperature $T_{max}$.

Figure 3A:
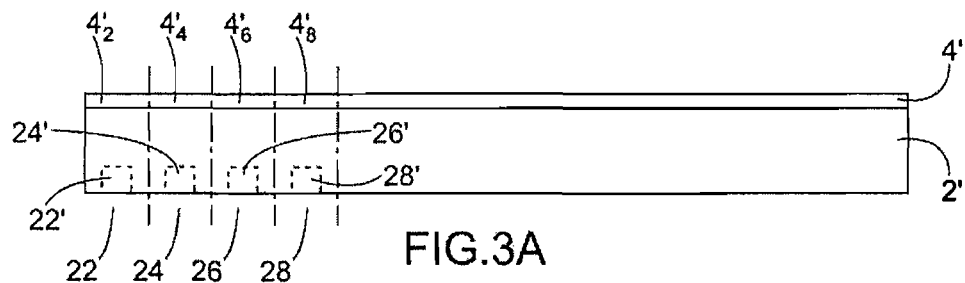
FIGS. 3A to 3C represent a variant of a process according to the invention.
Figure 3B:
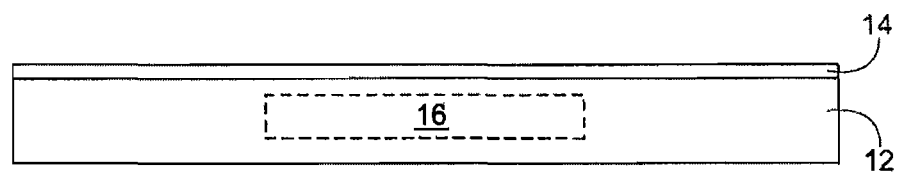
Figure 3C:
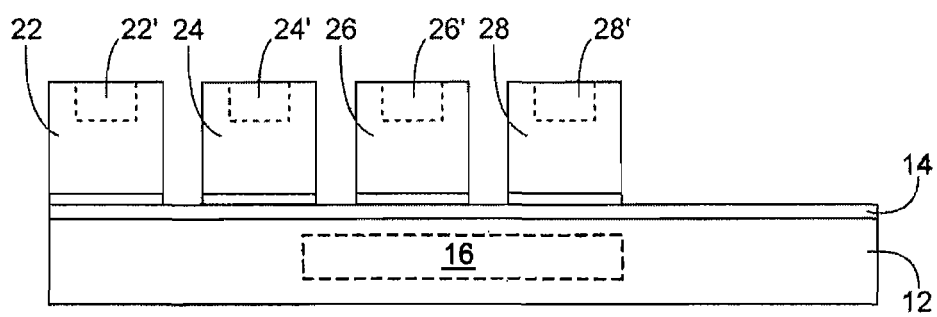

This example is represented in more detail in FIGS. 3A-3C. A bonding layer, which is a thin oxide layer 4', is formed on the surface of the first substrate 2' (see FIG. 3A). The substrate is for example made of a semiconductor material, advantageously made of silicon, or of germanium or of glass.

This oxide layer 4' is formed in the same way (in particular with the same low temperature) as the layer 4 described above in connection with FIG. 1A. It will therefore have the same characteristics, especially porosity characteristics.

In this embodiment, the substrate 2' is then cut up into one or more individual chips 22, 24, 26, 28 as symbolized in FIG. 3A by the vertical broken lines. Each individual chip itself comprises one or more circuits or components 22', 24', 26', 28' and is surmounted by a portion of bonding layer $4'_2$, $4'_4$, $4'_6$, $4'_8$.

A second substrate 12, represented in FIG. 3B, is identical to the substrate 12 which has already been described above in connection with FIG. 1B, and its bonding layer 14 is obtained under the same conditions as those already presented.

It is then possible to subject each of the individual chips 22, 24, 26, 28, and the substrate 12 from FIG. 3B to a first annealing heat treatment before assembling, in accordance with the present invention, as described above, for example with a change in temperature according to one of the diagrams represented in any one of FIGS. 2A-2C.

After this first annealing, it is possible to assemble the individual chips and the substrate 12 thus treated, via the free surfaces of the bonding layers $4'_2$, $4'_4$, $4'_6$, $4'_8$ and 14. This assembling step may be preceded by a preparatory treatment step, for example a chemical mechanical polishing (CMP) of the bonding layer of each individual chip and of the bonding layer 14 of the substrate 12.

As a variant, the substrate 2' may be cut up into individual chips 22, 24, 26, 28 after the pre-assembly annealing step. The other operations are similar to what has already been described above.

A particular example of the above-described embodiments will now be given.

A first wafer or substrate (plate) 2 and a second wafer or substrate (plate) 12 are provided, where at least one plate comprises circuits or microcomponents 6, 16. The configuration is therefore that which was described above in connection with FIGS. 1A and 1B.

On each of the surfaces to be assembled, a bonding layer 4, 14 made of $SiO_2$ is formed via a low temperature oxide formation (LTO) technology, by PECVD, using silane and $N_2O$ or TMS (trimethylsilane) and $N_2O$ precursors.

This deposition is carried out at low temperature (less than or equal to 250° C.). This type of low-temperature deposition is favorable to obtaining a high bonding energy, since the oxide thus formed is relatively porous and/or has a low density. This characteristic enables this bonding layer to subsequently absorb excess water trapped at the bonding interface, during the bond strengthening annealing, after assembling the substrates and joining the two $SiO_2$ bonding layers 4, 14 at their respective exposed surfaces.

These oxides are then annealed following the process of the invention: a ramp of 0.1° C./min to 5° C./min (for example: 1° C./min) in order to reach a temperature between 350° C. and 400° C. The annealing is continued for 12 h at this degassing annealing temperature. The relatively slow rise in temperature ensures a successive degassing of the species incorporated into the bonding oxides 4, 14 according to their various activation energies.

Next, the plates are prepared with a view to the assembly thereof, by surface planarization so as to provide a roughness compatible with molecular bonding (roughness <0.5 nm RMS), then by cleaning, which may be supplemented by a brushing of the plate surfaces to be assembled.

Next, the assembly of the two plates is carried out by "molecular" bonding, and this assembly is annealed at a temperature which does not exceed the degassing annealing temperature, so as not to trigger the migration towards the bonding interface of species still present in the oxide and which would not have been eliminated during the preceding heat treatment.

Following this process, it is possible to obtain bonding energies of around 3.6 $J/m^2$, of good quality: specifically, an absence of defects of a "bubble" type at the bonding interface is noted. This value should be compared with the bonding energy of around 2 $J/m^2$ for a standard oxide/oxide bonding utilizing nonporous/dense oxides.

Comparative tests were carried out for various types of oxides, prepared at various temperatures.

Figure 4:
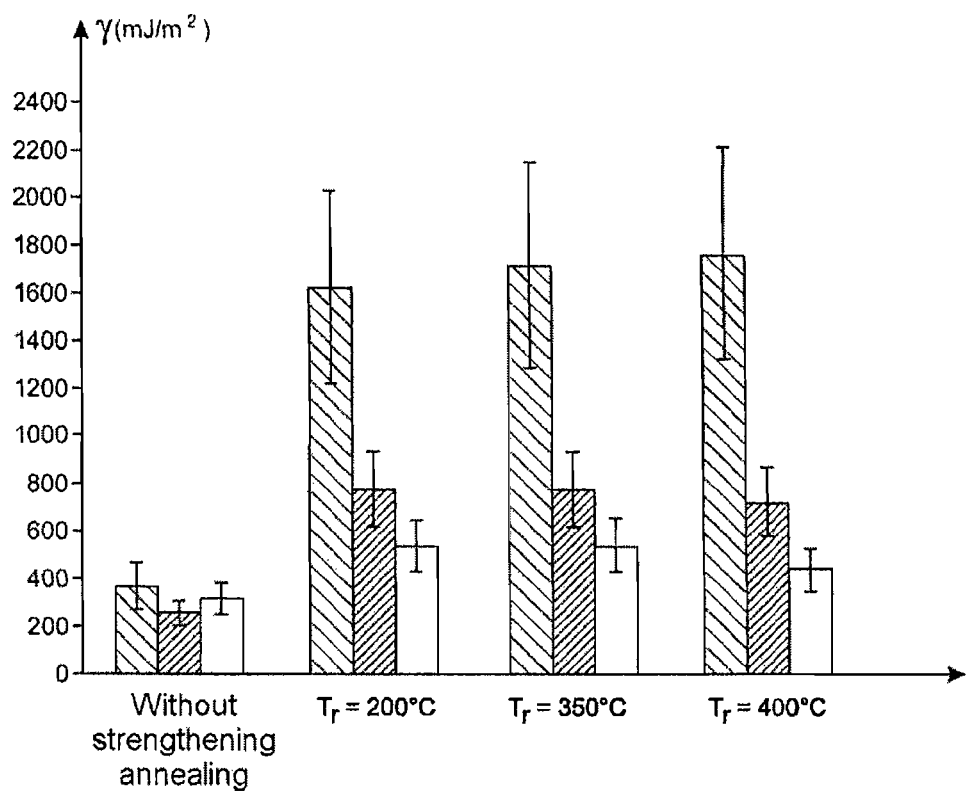
FIG. 4 represents results for the measurements of bonding energy carried out within the context of comparative tests.

The corresponding measurements are collated in FIG. 4. Three types of $SiO_2$ oxide were able to be compared. They were deposited by PECVD:

1) the first is an oxide of TEOS (tetraethyl orthosilicate) type, deposited at 400° C., with a deposition rate of 14 nm/s;

2) the second is an oxide of "silane oxide" type deposited at 210° C., with a deposition rate of 4.5 nm/s; and 3) the third is an oxide of "silane oxide" type, deposited at 400° C., with a deposition rate of 10 nm/s.

Supplementary measurements of the bonding energy were carried out with the same materials as above, but before any strengthening annealing: these measurements are identified in FIG. 4 by the expression "without strengthening annealing". They therefore correspond to measurements of the bonding energy in the case where no strengthening annealing has yet been carried out.

As is understood from the conditions indicated above, only the second oxide was deposited at a temperature below 250° C.

Apart from the diagrams identified by the expression "without strengthening annealing", the various other diagrams from FIG. 4 represent γ (in $mJ/m^2$), equal to half the bonding energy (on the y-axis), obtained with these three materials, as a function of the strengthening annealing temperature $T_r$ (on the x-axis). The latter varies between 200° C. and 400° C.

It can be observed that, for the second material, low temperature oxide (LTOB), in light cross-hatching on the diagrams, the bonding energy is at least two times greater than that obtained for the first material (TEOS), in dense cross-hatching on the diagrams, and almost triple that obtained with the third material (silane oxide), in white on the diagrams.

It is apparent that there is very great superiority of the bonding in favor of the second oxide regardless of the strengthening annealing temperature $T_r$ (200° C., 350° C., or 400° C.). It is only under the "without strengthening annealing" conditions that there is no difference between all three of the materials.

These tests, therefore, show that a low-temperature deposition of the bonding layers makes it possible to obtain a certain porosity of the deposited oxide, which is lower than that obtained with a high-temperature PECVD.

In addition, without a bond strengthening annealing, the bonding energy remains very low.

Therefore it is clearly seen that the combination of a low temperature for the formation of the bonding layers and for the strengthening annealing, at a strengthening temperature below 450° C., results in high-energy bonding of good quality. As indicated above, the bonding energy is equal to twice the value of the parameter γ measured: it therefore indeed reaches a value of at least 3 $J/m^2$.

In these diagrams from FIG. 4, the same levels of bonding energies are found for the materials deposited at 400° C. as the energy level represented in FIG. 3 of the document by C. S. Tan et al. "Low temperature thermal oxide to plasma-enhanced chemical vapor deposition oxide wafer bonding for thin film transfer application", Applied Physics Letters, Vol. 82, No. 116, p. 2649-2651, 2003. In this document, the oxide layers are themselves also deposited at 400° C.

The comparative tests which are presented in connection with FIG. 4 are therefore clearly consistent with the data known from the prior art.

What is claimed is:

1. A method for bonding two surfaces at low temperatures comprising:
    forming at a low temperature a first bonding layer on a first substrate and a second bonding layer on a second substrate, wherein at least one of the first substrate or the second substrate comprises one or more components, micro-components or circuits, wherein the first bonding layer and the second bonding layer each have an exposed surface, and the formation of each bonding layer is done at a low temperature that is less than or equal to 300° C.;
    conducting a first annealing of the first and second bonding layers on the first and second substrates for a first annealing time period, wherein the first annealing is conducted up to and at an annealing temperature that is higher than the low temperature of formation of each bonding layer and is at least 350° C. but less than 450° C. and for a time which does not deleteriously affect the components, micro-components or circuits;
    assembling the annealed first and second substrates to form a structure by bringing into contact the exposed surfaces of the first bonding layer and the second bonding layer; and
    conducting a second annealing of the first and second bonding layers of the bonded first and second substrates after assembling the structure, with the second annealing conducted at a second temperature of at least 350° C. and lower than or at most equal to the first annealing temperature,
    wherein the second annealing is conducted at a temperature and time which does not deleteriously affect the components, micro-components or circuits, and
    wherein the annealings provide a bonding interface between the substrates that has a bonding energy of at least 4 $J/m^2$.

2. The method according to claim 1, wherein the first annealing is conducted for a time sufficient to remove contaminants from the bonding layers.

3. The method according to claim 1, wherein at least one of the bonding layers is formed by a Plasma Enhanced Chemical Vapor Deposition or a Low Pressure Chemical Vapor Deposition.

4. A method for bonding two surfaces at low temperatures comprising:
  forming at a low temperature a first bonding layer on a first substrate and a second bonding layer on a second substrate, wherein at least one of the first substrate or the second substrate comprises one or more components, micro-components or circuits, wherein the first bonding layer and the second bonding layer each have an exposed surface, and at least one of the bonding layers is formed at a temperature less than or equal to 250° C. and the formation of the other bonding layer is done at a low temperature that is less than or equal to 300° C.;
  conducting a first annealing of the first and second bonding layers on the first and second substrates for a first annealing time period, wherein the first annealing is conducted at an annealing temperature that is higher than the low temperature of formation of each bonding layer and is at least 350° C. but less than 450° C. and for a time which does not deleteriously affect the components, micro-components or circuits;
  assembling the annealed first and second substrates to form a structure by bringing into contact the exposed surfaces of the first bonding layer and the second bonding layer; and
  conducting a second annealing of the first and second bonding layers of the bonded first and second substrates after assembling the structure, with the second annealing conducted at a second temperature of at least 350° C. and lower than or at most equal to the first annealing temperature,
  wherein the second annealing is conducted at a temperature and time which does not deleteriously affect the components, micro-components or circuits, and
  wherein the annealings provide a bonding interface between the substrates that has a bonding energy of at least 4 J/m².

5. The method according to claim 1, wherein at least one of the bonding layers is an oxide or a nitride material.

6. The method according to claim 5, wherein at least one of the bonding layers is a silicon oxide.

7. The method according to claim 1, wherein the second annealing is a bonding interface strengthening annealing conducted at a temperature (Tr) below 400° C.

8. The method according to claim 7, wherein the temperature of the first annealing increases at a rate between 1° C./min and 5° C./min to provide a temperature ramp.

9. The method according to claim 1, wherein the first annealing time period lasts between 10 minutes and 5 h.

10. The method according to claim 9, wherein the first annealing time period lasts between 30 minutes and 2 h.

11. The method according to claim 1, which further comprises preparing the surfaces of the first bonding layer and the second bonding layer for bonding before assembling the first and second substrates.

12. The method according to claim 11, wherein the preparing of the surfaces is by chemical-mechanical polishing, wherein the contacting of the exposed surfaces of the first bonding layer and the second bonding layer produces bonding by molecular adhesion.

13. The method according to claim 1, wherein one of the first substrate and first bonding layer or the second substrate and second bonding layer are cut into one or more chips.

14. The method according to claim 1, which further comprises; cutting of one of the substrates into one or more chips before assembling the first and second substrates to form a structure so that individual chips may be assembled with the other substrate, wherein at least one of the substrates or chips are made of a semiconductor material.

15. A method for bonding two surfaces at low temperatures comprising:
  forming at a low temperature a first bonding layer on a first substrate and a second bonding layer on a second substrate, wherein at least one of the first substrate or the second substrate comprises one or more components, micro-components or circuits, wherein the first bonding layer and the second bonding layer each have an exposed surface, and the formation of each bonding layer is done at a low temperature that is less than or equal to 250° C.;
  conducting a first annealing of the first and second bonding layers on the first and second substrates for a first annealing time period, wherein the first annealing is conducted at an annealing temperature that is higher than the low temperature of formation of each bonding layer and is at least 350° C. but less than 450° C. and for a time which does not deleteriously affect the components, micro-components or circuits, and the first annealing comprises an initial temperature that is increased at a rate between 1° C./min and 5° C./min to provide a temperature ramp up to the first annealing temperature, and wherein the first annealing time period lasts between 10 minutes and 5 h;
  assembling the annealed first and second substrates to form a structure by molecular bonding by bringing into contact the exposed surfaces of the first bonding layer and the second bonding layer; and
  conducting a second annealing of the first and second bonding layers of the bonded first and second substrates after assembling the structure, with the second annealing conducted at a second temperature of at least 350° C. and lower than or at most equal to the first annealing temperature,
  wherein the second annealing is conducted at a temperature and time which does not deleteriously affect the components, micro-components or circuits; and
  wherein the annealings provide a bonding interface between the substrates that has a bonding energy of at least 4 J/m².

16. The method according to claim 1, wherein at least one of the bonding layers is an oxide or nitride material; wherein at least one of the substrates is made of a semiconductor material and wherein the bonding between the first and second bonding layers at the bonding interface is of molecular adhesion type.

17. The method according to claim 4, wherein at least one of the bonding layers is an oxide or nitride material; wherein at least one of the substrates is made of a semiconductor material and wherein the bonding between the first and second bonding layers at the bonding interface is of molecular adhesion type.

18. The method according to claim 15, wherein at least one of the bonding layers is an oxide or nitride material and wherein at least one of the substrates is made of a semiconductor material.

19. A method for increasing bond strength and reducing contaminants when bonding two semiconductor substrates, which comprises:
  forming a first bonding layer on a first substrate and forming a second bonding layer on a second substrate, wherein at least one of the substrates comprises one or more components, micro-components or circuits, wherein the first bonding layer and the second bonding layer each have an exposed surface, and the formation of each bonding layer is done at a temperature that is less than or equal to 300° C.;

conducting a first annealing of each of the first and second substrates for a first annealing time period and up to a first annealing temperature of at least 350° C. but less than 450° C. to degas contaminants from the substrates;

assembling the annealed first and second substrates to form a structure by molecular bonding by bringing into contact the exposed surfaces of the first and second bonding layers; and conducting a second annealing of the bonded first and second substrates at a second temperature that is at least 350° C. but below 450° C., wherein the second annealing temperature does not exceed the first annealing temperature;

wherein the annealings provide a bonding interface between the substrates that has a bonding energy of at least 4 J/m$^2$ and without a reduction in porosity of the bonding layers; and wherein the first and second annealings are conducted at a temperature and time which does not deleteriously affect the components, micro-components or circuits.

20. The method according to claim 19, wherein at least one of the bonding layers is an oxide or nitride material and wherein at least one of the substrates is made of a semiconductor material.

* * * * *